(12) United States Patent
Tojo et al.

(10) Patent No.: US 6,693,935 B2
(45) Date of Patent: Feb. 17, 2004

(54) SEMICONDUCTOR LASER

(75) Inventors: Tsuyoshi Tojo, Miyagi (JP); Shiro Uchida, Miyagi (JP)

(73) Assignee: Sony Corporation (JP)

( * ) Notice: Subject to any disclaimer, the term of this patent is extended or adjusted under 35 U.S.C. 154(b) by 118 days.

(21) Appl. No.: 09/883,235

(22) Filed: Jun. 19, 2001

(65) Prior Publication Data

US 2002/0024981 A1 Feb. 28, 2002

(30) Foreign Application Priority Data

Jun. 20, 2000 (JP) .................................... P2000-183920
Jul. 7, 2000 (JP) .................................... P2000-207229

(51) Int. Cl.[7] .......................... H01S 5/00; H01L 27/15; H01L 33/00; H01L 29/12
(52) U.S. Cl. ..................... 372/45; 372/43; 257/79; 257/99; 257/103; 257/613; 257/615
(58) Field of Search ................ 372/43, 45; 257/79, 257/99, 103, 613, 615

(56) References Cited

U.S. PATENT DOCUMENTS 5,701,321 A * 12/1997 Hayafuji et al. ............ 372/44
5,862,167 A * 1/1999 Sassa et al. ................ 372/45
6,495,862 B1 * 12/2002 Okazaki et al. ............. 257/103

FOREIGN PATENT DOCUMENTS

| JP | 6-204609 | 7/1994 |
| JP | 10-022565 | 1/1998 |
| JP | 11-017223 | 1/1999 |
| JP | 11-087850 | 3/1999 |
| JP | 11-261109 | 9/1999 |

* cited by examiner

*Primary Examiner*—Eddie Lee
*Assistant Examiner*—Joseph Nguyen
(74) *Attorney, Agent, or Firm*—Rader, Fishman & Grauer PLLC; Ronald P. Kananen

(57) ABSTRACT

A semiconductor laser includes semiconductor layers stacked on a substrate, and a pair of resonator end surfaces opposed to each other in the direction perpendicular to the stacking direction. In this semiconductor laser, a light emission side reflecting film is formed on one of the resonator end surfaces. A refractive index of the reflecting film against an emission wavelength of laser light is set to a value between an effective refractive index and a refractive index of the substrate. Another semiconductor laser includes a light emission function layer stack including a cladding layer and an active layer formed on one place of a translucent substrate; two electrodes having different polarities, which are provided on the light emission function layer stack side; and a light leakage preventive film formed on the other plane of the translucent substrate.

6 Claims, 7 Drawing Sheets

SEMICONDUCTOR LASER

BACKGROUND OF THE INVENTION

The present invention relates to a semiconductor laser including semiconductor layers stacked on a substrate and a pair of resonator end surfaces opposed to each other in the direction perpendicular to the stacking direction.

In recent years, a semiconductor laser (laser diode: LD) has been used for various optical systems. In general, a semiconductor laser has a structure in which a first conductive type semiconductor layer, an active layer, and a second conductive type semiconductor layer are sequentially stacked on a substrate, wherein light generated from the active layer is amplified between a pair of resonator end surfaces opposed to each other in the direction perpendicular to the stacking direction. In many cases, reflecting films for adjusting the reflectance and protecting the resonator end surfaces are provided on the pair of resonator end surfaces. The reflecting film on the side from which laser light is mainly emitted is adjusted such that the reflectance thereof becomes lower, and the reflecting film on the non-light emission side is adjusted such that the reflectance thereof becomes higher.

These reflecting films are generally each configured to have a single layer structure or a multi-layer structure depending on the application of the semiconductor laser. In particular, the light emission side reflecting film is often configured to have a single layer structure from the viewpoint of simplicity of film formation. For example, in a semiconductor laser in which nitride based group III-V compound semiconductor layers are stacked on a sapphire substrate, a reflecting film on the light emission side generally has a single layer structure of aluminum oxide ($Al_2O_3$) or silicon oxide ($SiO_2$) having a refractive index against an emission wavelength, which is smaller than that of the stack of the nitride based group III-V compound semiconductor layers.

The reflecting film made from aluminum oxide or silicon oxide, however, has a problem. Namely, the refractive index of the reflecting film against an emission wavelength, which is smaller than that of the nitride based group III-V compound semiconductor layers as described above, also becomes smaller than that of the substrate. Accordingly, as shown in FIG. 11, if the thickness of the reflecting film is adjusted such that the reflectance in a region, corresponding to the nitride based group III-V compound semiconductor layers, of the reflecting film becomes lower, the reflectance in a region, corresponding to the substrate, of the reflecting film also becomes lower. In addition, FIG. 11 shows a relationship between a thickness of a reflecting film and a reflectance of the reflecting film against an emission wavelength of 400 nm for a semiconductor laser in which nitride based group III-V compound semiconductor layers are stacked on a sapphire substrate and a reflecting film made from aluminum oxide is formed on the light emission side. In the figure, a solid line designates the reflectance in a region, corresponding to the substrate, of the reflecting film and a broken line designates the reflectance in a region, corresponding to an active layer (an oscillation region), of the reflecting film.

Further, since the sapphire substrate is translucent against an emission wavelength, if the semiconductor laser is used while being contained in a package, stray light reflected in the package may enter the semiconductor laser from the region, corresponding to the substrate, of the reflecting film.

As a result, there arises a problem in causing noise and thereby degrading the characteristics of the semiconductor laser.

The present invention also relates to a semiconductor laser including various function films provided on a translucent substrate such as a sapphire substrate.

A semiconductor laser using a translucent substrate such as a sapphire substrate has a problem that much of laser light is leaked through the sapphire substrate as spontaneous emission light. The spontaneous emission light may be emerged to the outside of a package in which the semiconductor laser is contained, to exert adverse effect on peripheral parts.

In particular, for the next-generation optical pickup in which a storage medium (disk) is closer to a semiconductor laser, the above-described spontaneous emission light may become a serious problem because it causes noise.

From the viewpoint of preventing the leakage of such spontaneous emission light, Japanese Patent Laid-open No. Hei 11-87850 discloses a semiconductor laser in which a light absorbing layer having a band gap smaller than that of an active layer is provided in a stack of semiconductor layers.

From the viewpoint of increasing an output efficiency of light, Japanese Patent Laid-open No. Hei 11-17223 discloses a semiconductor laser in which a reflecting layer for reflecting light emitted from an active layer is provided in a stack of semiconductor layers.

The above-described related art semiconductor lasers, however, have problems. Namely, since the light absorbing layer for preventing leakage of spontaneous emission light or the reflecting layer for increasing the output efficiency of light is built in the stack of semiconductor layers, it is difficult to set a light absorbing condition, a light reflecting condition, and a film formation condition because such conditions must be set in consideration of the relationship with adjacent other films. Further, since the light absorbing film or the light reflecting layer is provided in the stack of semiconductor layers, the original characteristics of the semiconductor laser may be degraded, thereby failing to achieve a desired performance of the semiconductor laser.

SUMMARY OF THE INVENTION

A first object of the present invention is to provide a semiconductor laser capable of suppressing stray light from entering the semiconductor laser from a region, corresponding to a substrate, of a light emission side reflecting film, thereby improving the characteristics of the semiconductor laser.

A second object of the present invention is to provide a semiconductor laser using a translucent substrate, which is capable of suppressing leakage of spontaneous emission light.

To achieve the first object, according to the first invention, there is provided a semiconductor laser including a substrate, semiconductor layers stacked on the substrate, and a pair of resonator end surfaces opposed to each other in the direction perpendicular to the stacking direction, the semiconductor laser including: a light emission side reflecting film formed on one of the resonator end surfaces; wherein a refractive index of the reflecting film against an emission wavelength of laser light is set to a value between an effective refractive index and a refractive index of the substrate.

With this configuration, the reflective index of the reflecting film against an emission wavelength of laser light is set to a value between the effective refractive index and a refractive index of the substrate, and accordingly, if the thickness of the reflecting film is adjusted such that the reflectance in a region, corresponding to an oscillation region of laser light, of the reflecting film becomes lower, the reflectance in a region, corresponding to the substrate, of the reflecting film becomes higher, with a result that stray light entering the semiconductor laser from the region, corresponding to the substrate, of the reflecting film can be reduced.

To achieve the second object, according to the second invention, there is provided a semiconductor laser including: a light emission function layer stack including a cladding layer and an active layer formed on one plane of a translucent substrate; two electrodes having different polarities, which are provided on the light emission function layer stack side; and a light leakage preventive film formed on the other plane of the translucent substrate.

To achieve the second object, according to the second invention, there is also provided A semiconductor laser including: a light emission function layer stack including a cladding layer and an active layer formed on one plane of a translucent substrate; and an electrode serving as light leakage preventive film for shielding light and injecting a current in the light emission function layer stack, which is formed on the other plane of the translucent substrate.

With these configurations, the light leakage preventive film is formed on the surface, opposed to the light emission function layer stack, of the translucent substrate, and accordingly, even if laser light generated from the light emission function layer stack is leaked to the translucent substrate side, it is absorbed or reflected in or from the light leakage preventive film, to thereby suppress leakage of light to the outside. Further, since the light leakage preventive film is formed on the side, opposed to the light emission function layer stack, of the translucent substrate, it is possible to prevent the light leakage preventive film from exerting an adverse effect on the laser light generation characteristic by the light emission function layer stack.

DETAILED DESCRIPTION OF THE PREFERRED EMBODIMENTS

Hereinafter, a preferred embodiment of a first invention will be described in detail with reference to the drawings.

Figure 1:
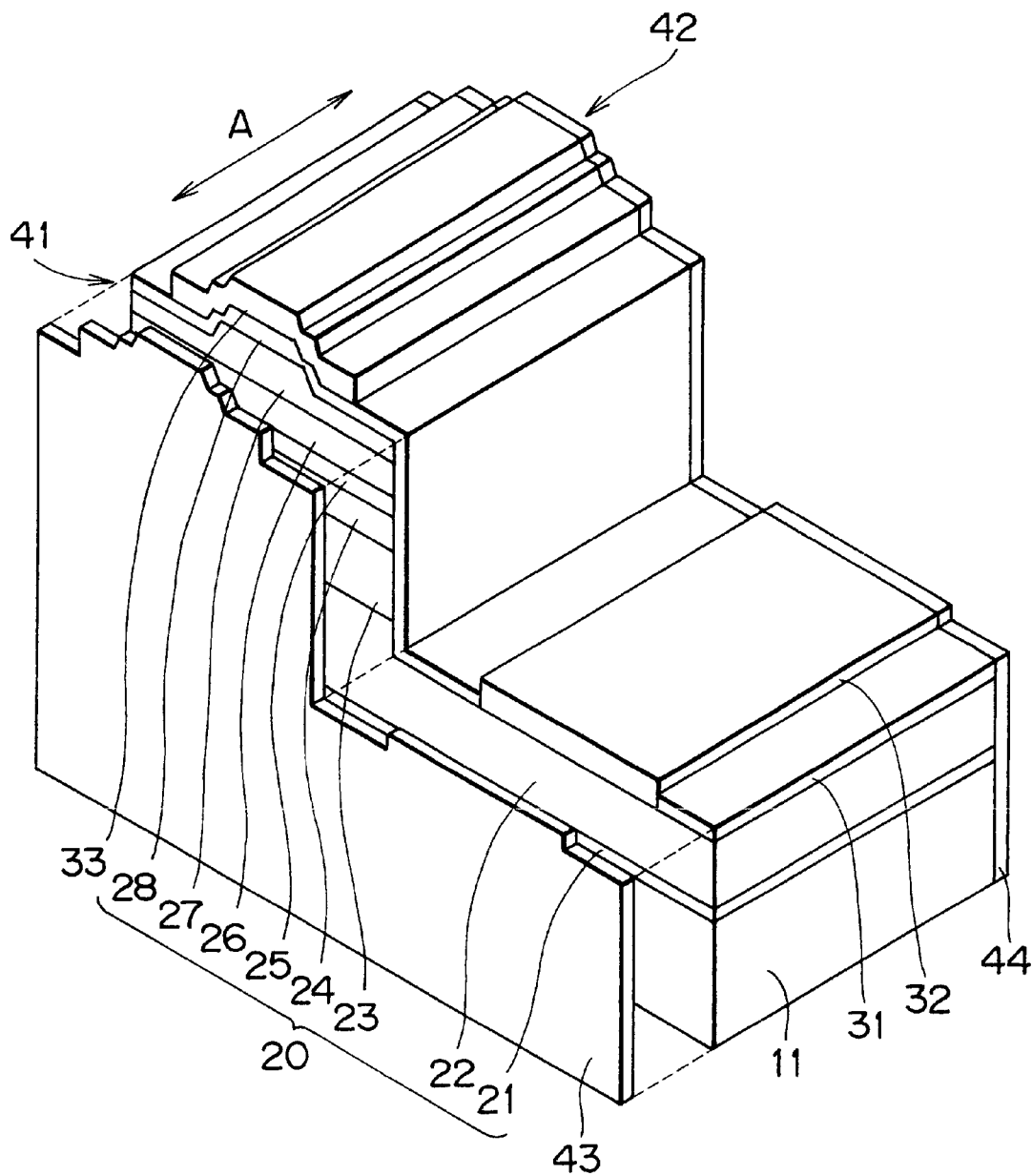
FIG. 1 is a partial exploded perspective view showing a configuration of a semiconductor laser according to one embodiment of the first invention.

FIG. 1 shows a configuration of a semiconductor laser according to the embodiment of the first invention. The semiconductor laser includes a semiconductor layer stack 20 on one plane of a substrate 11. Each layer of the semiconductor layer stack 20 is composed of a nitride based III-V compound semiconductor containing at least one kind of group IIIA elements and at least nitrogen (N) of group VA elements in the short-period type periodic table. The semiconductor layer stack 20 has a buffer layer 21, an n-side contact layer 22, an n-type cladding layer 23, an n-type guide layer 24, an active layer 25, a p-type or n-type guide layer 26, a p-type cladding layer 27, and a p-side contact layer 28, which layers are sequentially stacked in this order on the substrate 11. Of these layers, the n-side contact layer 22, the n-type cladding layer 23, and the n-type guide layer 24 or 26 are n-type semiconductor layers which correspond to first conductive type semiconductor layers, while the p-type guide layer 26, the p-type cladding layer 27, and the p-side contact layer 28 are p-type semiconductor layers which correspond to second conductive type semiconductor layers.

The substrate 11 is made from sapphire having a thickness in the stacking direction (hereinafter, referred to simply as "thickness") of 90 $\mu$m. The semiconductor layer stack 20 is formed on the c-plane of the substrate 11.

The buffer layer 21, which has a thickness of 30 nm, is made from undoped GaN. The n-side contact layer 22, which has a thickness of 3 $\mu$m, is made from n-type GaN doped with silicon (Si) as an n-type impurity. The n-type cladding layer 23, which has a thickness of 1 $\mu$m, is made from n-type AlGaN mixed crystal doped with silicon as an n-type impurity. The n-type guide layer 24, which has a thickness of 0.1 $\mu$m, is made from n-type GaN or n-type InGaN doped with silicon as an n-type impurity.

The active layer 25, which has a thickness of 30 nm, has a multi-quantum well structure formed by stacking mixed crystal layers to each other. The mixed crystal layers are made from $Ga_xIn_{1-x}N$ ($1 \geq x \geq 0$), wherein the value of x differs for each mixed crystal layer. At least part of the active layer 25 functions as a light emitting portion. The wavelength of light emitted from the light emitting portion is typically set to about 400 nm.

The p-type guide layer 26 or n-type guide layer 26, which has a thickness of 0.1 $\mu$m, is made from p-type GaN or InGaN doped with magnesium (Mg) as a p-type impurity. The p-type guide layer 26 may be replaced with the n-type guide layer 26 which may be made from undoped GaN or n-type GaN doped with silicon (Si) as an n-type impurity. The p-type cladding layer 27, which has a thickness of 0.8 $\mu$m, is made from p-type AlGaN mixed crystal doped with magnesium as a p-type impurity. The p-side contact layer 28, which has a thickness of 0.5 $\mu$m, is made from p-type GaN doped with magnesium as a p-type impurity. In addition, part of each of the p-side contact layer 28 and the p-type cladding layer 27 is formed into a narrow strip shape extending in a resonator direction A perpendicular to the stacking direction of the semiconductor layer stack 20. Accordingly, the semiconductor laser in this embodiment enables current constriction, thereby allowing a region, corresponding to the p-side contact layer 28, of the active layer 25 to function as the light emitting portion.

In this semiconductor laser, the width of the n-side contact layer 22 in the direction perpendicular to the resonator direction A is set to be wider than the width of each of the n-type cladding layer 23, the n-type guide layer 24, the active layer 25, the n-type guide layer 26, the p-type cladding layer 27, and the p-side contact layer 28, and these n-type cladding layer 23, n-type guide layer 24, active layer 25, n-type guide layer 26, p-type cladding layer 27, the p-side contact layer 28 are stacked on part of the n-side contact layer 22.

An insulating film 31 made from silicon dioxide is formed to cover a region from the surface of the n-side contact layer 22 to the surface of the p-side contact layer 28. Openings are provided in the insulating film 31 at positions over the n-side contact layer 22 and the p-side contact layer 28. An n-side electrode 32 is formed on the n-side contact layer 22 via the n-side contact layer side opening, and a p-side electrode 33 is formed on the p-side contact layer 28 via the p-side contact layer side opening. The n-side electrode 32 is formed by sequentially stacking a titanium (Ti) layer and an aluminum (Al) layer on the n-side contact layer 22, and alloying the metals of these layers by heat-treatment. The n-side electrode 32 is electrically connected to the n-side contact layer 22. The p-side electrode 33 is formed by sequentially stacking a palladium (Pd) layer, a platinum (Pt) layer, and a gold (Au) layer on the p-side contact layer 28. The p-side electrode 33 is electrically connected to the p-side contact layer 28.

The semiconductor layer composed of the semiconductor layer stack 20 and the substrate 11 has a pair of resonator end surfaces 41 and 42 opposed to each other in the resonator direction A. A light emission side reflecting film 43 is formed on one resonator end surface 41, and a non-light emission side reflecting film 44 is formed on the other resonator end surface 42. The reflecting film 43 is adjusted such that the reflectance thereof against an emission wavelength in a region corresponding to an oscillation region of laser light becomes lower, and the reflecting film 44 is adjusted such that the reflectance thereof against an emission wavelength in a region corresponding to the oscillation region of laser light becomes higher. With this configuration, laser light generated by the active layer 25 and its neighborhood is amplified between the reflecting films 43 and 44 and is mainly emitted from the reflecting film 43 side. In addition, a laser beam is emitted even from the reflecting film 44 side depending on the reflectance thereof, although the quantity of the laser beam on the reflecting film 44 side is very much smaller than that on the reflecting film 43 side; however, in this specification, one reflecting film side from which a laser beam is intended to be emitted is called "light emission side" and the other reflecting film side is called "non-light emission side".

The reflecting film 43 contains at least one kind of aluminum nitride (AlN), zirconium oxide ($ZrO_2$), and silicon oxynitride ($SiO_xN_y$). Against an emission wavelength (typically, 400 nm) of laser light, the refractive index of the reflecting film 43 is set to a value between a refractive index of the substrate 11 and an effective refractive index. It is to be noted that the effective refractive index means an average refractive index in an oscillation region of laser light, and that the oscillation region of laser light is mainly the active layer 25 and further contains its neighborhood, for example, the n-type guide layer 24, the p-type guide layer 26, and part of the n-type cladding layer 23, and part of the p-type cladding layer 27.

According to this embodiment, against an emission wavelength of 400 nm, the refractive index of the substrate 11 is set to 1.77 and the effective refractive index is set to 2.5, and the refractive index of the reflecting film 43 is set to be larger than the refractive index of the substrate 11 and is smaller than the effective refractive index. With respect to the refractive index of the reflecting film 43 (containing at least one kind of aluminum nitride, zirconium oxide, and silicon oxynitride) against an emission wavelength of 400 nm, the refractive index of aluminum nitride is 2.13, the refractive index of zirconium oxide is 2.07, and the refractive index of silicon oxynitride varies in a range of 1.5 to 2.07 depending on the contents of oxygen (O) and nitrogen (N).

The reason why the refractive index of the reflecting film 43 is specified as described above is as follows: namely, in the case where the thickness of the reflecting film 43 is adjusted such that the reflectance thereof in the region corresponding to the oscillation region of laser light becomes lower, the reflectance thereof in the region corresponding to the substrate 11 can be made higher, to thereby suppress stray light from entering the semiconductor laser. In particular, it is preferred that the refractive index of the reflecting film 43 is set to a nearly intermediate value between the refractive index of the substrate 11 and the effective refractive index. In this case, when the reflectance in the region, corresponding to oscillation region of laser light, of the reflecting film 43 is minimized, the reflectance in the region, corresponding to the substrate 11, of the reflecting film 43 can be substantially maximized.

Figure 2:
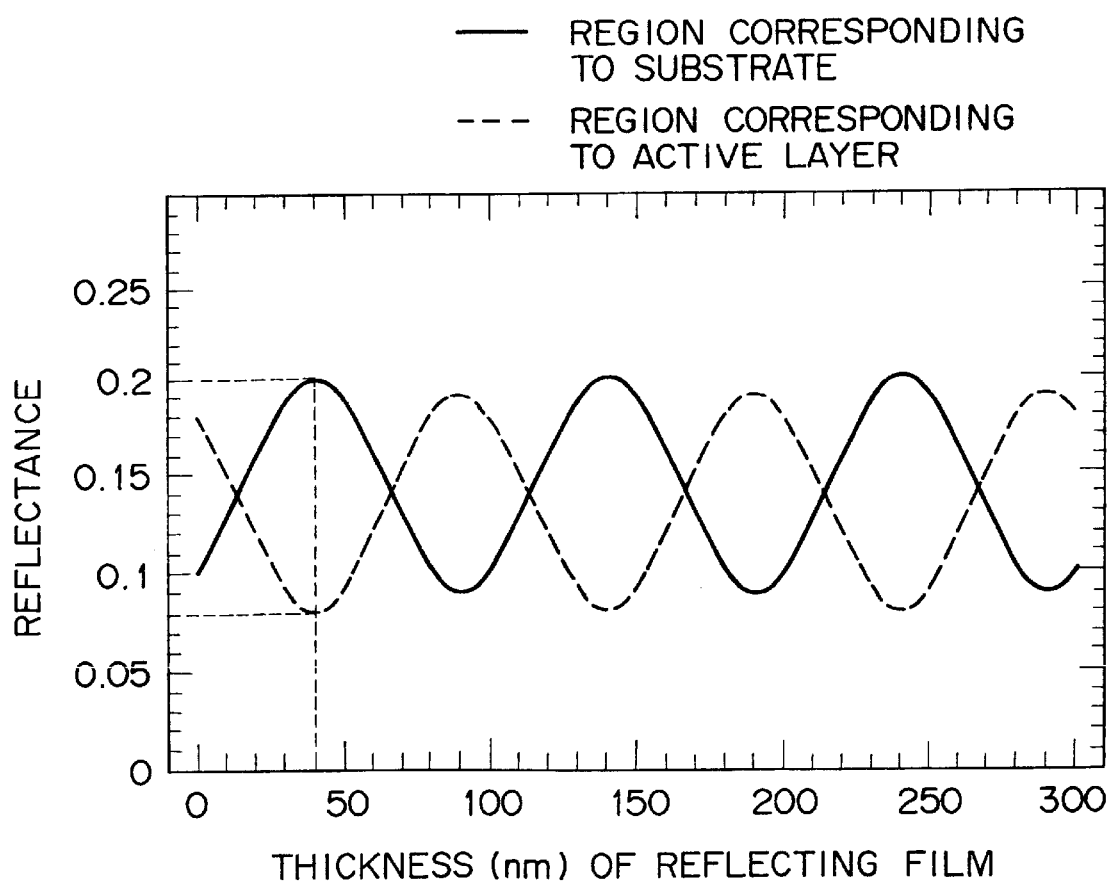
FIG. 2 is a characteristic diagram showing a relationship between a thickness and a reflectance of a reflecting film of the semiconductor laser shown in FIG. 1.

FIG. 2 is a graph showing a relationship between the thickness of the reflecting film 43 and the reflectance thereof against an emission wavelength of 400 nm. In addition, the reflecting film 43 used here is formed of a single layer film of aluminum nitride. In this figure, a solid line indicates a reflectance in a region, corresponding to the substrate 11, of the reflecting film 43, and a broken line indicates a reflectance in a region, corresponding to an oscillation region of laser light, of the reflecting film 43.

Figure 11:
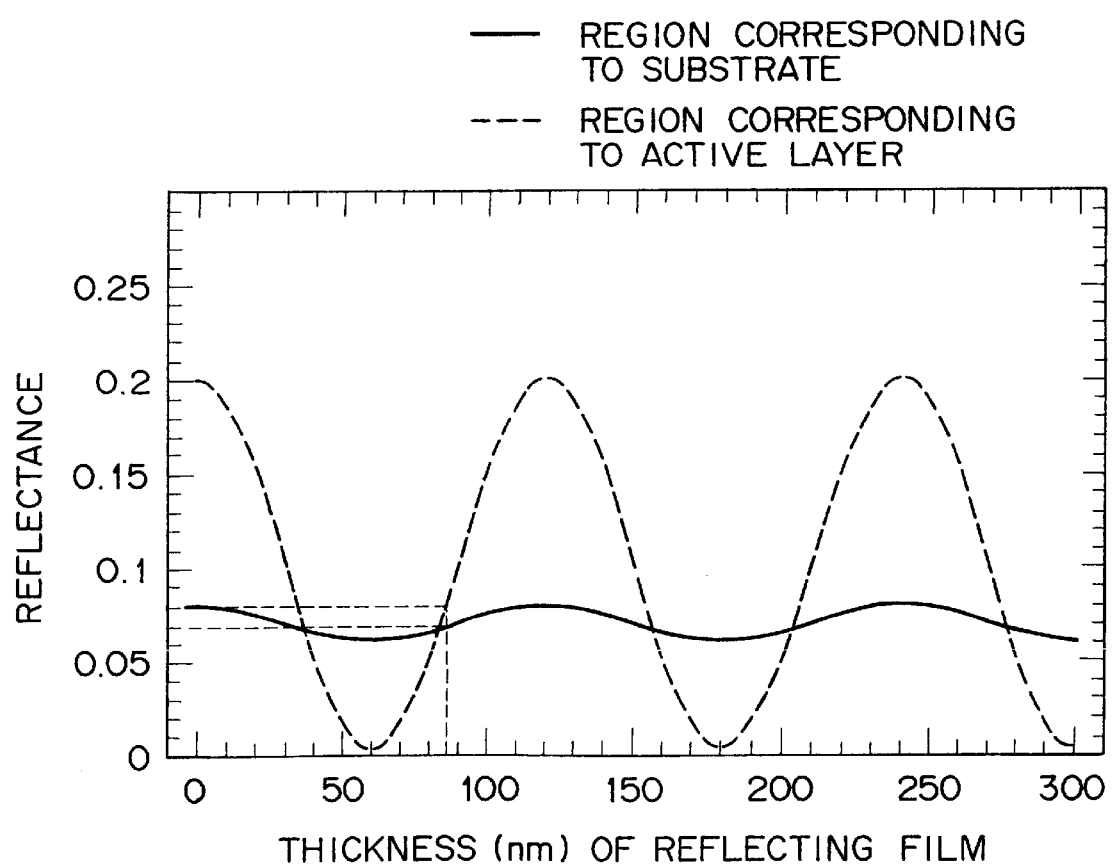
FIG. 11 is a characteristic diagram illustrating a relationship between a thickness and a reflectance of a reflecting film of a related art semiconductor laser.

As is apparent from this graph, in the case where the refractive index of the reflecting film 43 is set to a value between the refractive index of the substrate 11 and the effective refractive index, the relationship between the thickness and the reflectance of the reflecting film 43 is substantially reversed between in the region corresponding to the substrate 11 and in the region corresponding to the oscillation region of laser light. Accordingly, as shown in FIG. 2, if the reflectance in the region corresponding to the oscillation region of laser light is set to about 8%, the reflectance in the region corresponding to the substrate 11 becomes as large as about 20%. On the contrary, in the example associated with the related art reflecting film shown in FIG. 11, if the reflectance in the region corresponding to the oscillation region of laser light is set to about 8%, the reflectance in the region corresponding to the substrate 11 becomes as small as about 7%. As a result, according to this embodiment, the reflectance in the region, corresponding to the substrate 11, of the reflecting film 43 becomes nearly three times that in the related art reflecting film, and therefore, the quantity of stray light entering the semiconductor laser from the region corresponding to the substrate 11 becomes nearly one-third that in the related art reflecting film.

The reflecting film 43 may be configured to have a single layer structure or a multi-layer structure; however, it may be desirable to adopt the single layer structure from the viewpoint of simplicity of film formation. The optical thickness L of the reflecting film 43 is preferably set to a value of $\lambda/4n$ where n is the refractive index of the reflecting film 43 and λ is an emission wavelength.

According to this embodiment, the reflecting film 43 is preferably made from aluminum nitride. The reason for this is as follows: namely, the refractive index of the reflecting film 43 made from aluminum nitride can be set to a nearly intermediate value between the refractive index of the substrate 11 and the effective refractive index. Also, since the thermal expansion coefficient of the reflecting film 43 made from aluminum nitride is closer to that of the semiconductor layer stack 20, it is possible to reduce stress applied to the resonator end surface 41 and hence to suppress deterioration thereof, and since the thermal conductivity of the reflecting film 43 made from aluminum nitride is higher, it is possible to suppress temperature rise at the resonator end surface 41. Further, since oxide or oxygen is not brought into contact with the resonator end surface 41, it is possible to prevent a catastrophic optical damage (COD) of the resonator end surface 41 due to oxidation.

On the other hand, the reflecting film 44 has a multi-layer structure (for example, six layers) in which silicon oxide films and titanium oxide ($TiO_2$) films are alternatively stacked.

The above-described semiconductor laser can be produced as follows:

A substrate 11 made from sapphire and having a thickness of about 400 $\mu$m is prepared, and the following layers are sequentially grown on the c-plane of the substrate 11 by a MOCVD process: a buffer layer 21 made from undoped GaN, an n-side contact layer 22 made from n-type GaN, an n-type cladding layer 23 made from n-type AlGaN mixed crystal, an n-type guide layer 24 made from n-type GaN, an active layer 25 made from GaInN mixed crystal, a p-type guide layer 26 made from p-type GaN, a p-type cladding layer 27 made from p-type AlGaN mixed crystal, and a p-side contact layer 28 made from p-type GaN.

In the MOCVD process, trimethyl gallium (($CH_3)_3$Ga) is used as a source gas of gallium, trimethyl aluminum (($CH_3)_3$Al) is used as a source gas of aluminum, trimethyl indium (($CH_3)_3$In) is used as a source gas of indium, and ammonia ($NH_3$) is used as a source gas of nitrogen; and further, monosilane ($SiH_4$) is used as a source gas of silicon, and bis(cyclopentadienyl)magnesium (($C_6H_5)_2$Mg) is used as a source gas of magnesium.

Parts of the p-side contact layer 28, p-type cladding layer 27, p-type guide layer 26, active layer 25, n-type guide layer 24, n-type cladding layer 23, and n-side contact layer 22 are sequentially etched, to expose the n-side contact layer 22 to the outside. Subsequently, a mask (not shown) is formed on the p-side contact layer 28, and parts of the p-side contact layer 28 and the p-type cladding layer 27 are selectively etched using the mask, to form each of the upper portion of the p-type cladding layer 27 and the p-side contact layer 28 into a narrow strip shape.

An insulating film 31 made from silicon oxide is formed over the exposed surface by a vapor-deposition process. An opening is formed in the insulating film 31 at a position over the p-side contact layer 28, to expose the surface of the p-side contact layer 28, and an opening is formed in the insulating film 31 at a position over the n-side contact layer 22. Titanium (Ti), aluminum (Al), platinum, and gold are sequentially deposited through the n-side contact layer 22 side opening and alloyed, to form an n-side electrode 32. Further, palladium, platinum, and gold are sequentially deposited on the exposed p-side contact layer 28, to form a p-side electrode 33.

The substrate 11 is polished into a thickness of about 90 $\mu$m. The substrate 11 thus polished is divided into parts each having a specific width in the direction perpendicular to the resonator direction A, to form resonator end surfaces 41 and 42 for each of the divided parts. A reflecting film 43 is formed on the resonator end surface 41 and a reflecting film 44 is formed on the resonator end surface 42 by an ECR (Electron Cyclotron Resonance) sputtering system. After formation of the reflecting films 43 and 44, the substrate 11 is divided into parts at specific positions in the direction parallel to the resonator direction A. The semiconductor laser shown in FIG. 1 is thus obtained.

The operation of the semiconductor laser thus obtained will be described below.

In this semiconductor laser, when a specific voltage is applied between the n-side electrode 32 and the p-side electrode 33, a current is injected in the active layer 25, to cause light emission due to electron-hole recombination. The light thus emitted is reflected and thereby amplified between the reflecting films 43 and 44, to cause laser oscillation. The oscillated light is then emitted to the outside as laser light mainly through the reflecting film 43. By the way, in the case where the semiconductor laser is used while being contained in a package, part of the laser light thus emitted is reflected in the package and is returned to the semiconductor laser as stray light. In this case, according to this embodiment, since the refractive index of the reflecting film 43 against an emission wavelength is set to a value between the refractive index of the substrate 11 and the effective refractive index, the reflectance in the region, corresponding to the substrate 11, of the reflecting film 43 becomes higher. As a result, it is possible to reduce the quantity of stray light entering the semiconductor laser from the region, corresponding to the substrate 11, of the reflecting film 43, and hence to suppress occurrence of noise and improve characteristics such as a variation in output.

According to the semiconductor laser in this embodiment, since the refractive index of the reflecting film 43 against an emission wavelength is set to a value between the refractive index of the substrate 11 and the effective refractive index, the reflectance in the region, corresponding to the substrate 11, of the reflecting film 43 can be made higher. As a result, it is possible to suppress stray light entering the semiconductor laser. This makes it possible to prevent occurrence of noise and to improve the characteristic of the semiconductor laser.

In particular, in the case of using the reflecting film 43 made from aluminum nitride, the reflectance in the region, corresponding to the substrate 11, of the reflecting film 43 can be made higher, and further the deterioration of the resonator end surface on the reflecting film 41 side can be suppressed, and the catastrophic optical damage of the neighborhood of the resonator end surface on the reflecting film 41 side due to oxidation can be prevented.

While the preferred embodiment of the present invention has been described, such description is for illustrative purposes only, and it is to be understood that changes and variations may be made without departing from the scope of the present invention. For example, the material for forming the reflecting film 43 is not limited to that described in the embodiment, and may be another material insofar as it has a refractive index against an emission wavelength between the refractive index of the substrate and the effective refractive index and further it does not absorb laser light.

While the substrate 11 is made from sapphire in the above embodiment, it may be made from another material.

In the above embodiment, the present invention is applied to the semiconductor laser including the stack 20 of semiconductor layers each of which is made from a nitride based group III-V compound semiconductor; however, the present invention can be applied to a semiconductor laser including a stack of semiconductor layers each of which is made from another semiconductor such as a group III-V compound semiconductor or a group II-VI compound semiconductor.

In the above embodiment, the refractive index of the reflecting film 43 against an emission wavelength is set to be larger than the refractive index of the substrate 11 and smaller than the effective refractive index; however, the refractive index of the reflecting film may be set to be smaller than the refractive index of the substrate and higher than the effective refractive index. Even in this case, the same effect as that described above can be obtained.

In the above embodiment, the present invention is applied to the semiconductor laser having a structure in which the n-side contact layer 22, n-type cladding layer 23, n-type guide layer 24, active layer 25, p-type guide layer 26, p-type cladding layer 27, and p-side contact layer 28 are sequentially stacked; however, the present invention can be applied to a semiconductor laser having another stacking structure. For example, the n-type guide layer 24 and the p-type guide layer 26 may be omitted, and a crystal deterioration preventive layer may be provided between the active layer 25 and the p-type guide layer 26. The current constriction may be configured by a structure other than the structure that the p-side contact layer 28 is formed into a narrow strip. The semiconductor laser may be of a reflectance waveguide type or gain waveguide type.

In the above embodiment, the n-type semiconductor layer is taken as the first conductive semiconductor layer and the p-type semiconductor layer is taken as the second conductive semiconductor layer; however, the p-type semiconductor layer is taken as the first conductive semiconductor layer and the n-type semiconductor layer is taken as the second conductive semiconductor layer.

In the above embodiment, the non-light emission side reflecting film 44 is provided on the other resonator end surface 42; however, a reflecting film having another configuration may be provided on the other resonator end surface or no reflecting film may be provided thereon.

According to the semiconductor laser of the first present invention, since the refractive index of the reflecting film on the light emission side against an emission wavelength is set to a value between the refractive index of the substrate and the effective refractive index, the reflectance in the region, corresponding to the substrate, of the reflecting film can be made higher, with a result that it is possible to suppress stray light entering the semiconductor laser. This makes it possible to prevent occurrence of noise and to improve the characteristic of the semiconductor laser.

Figure 3:
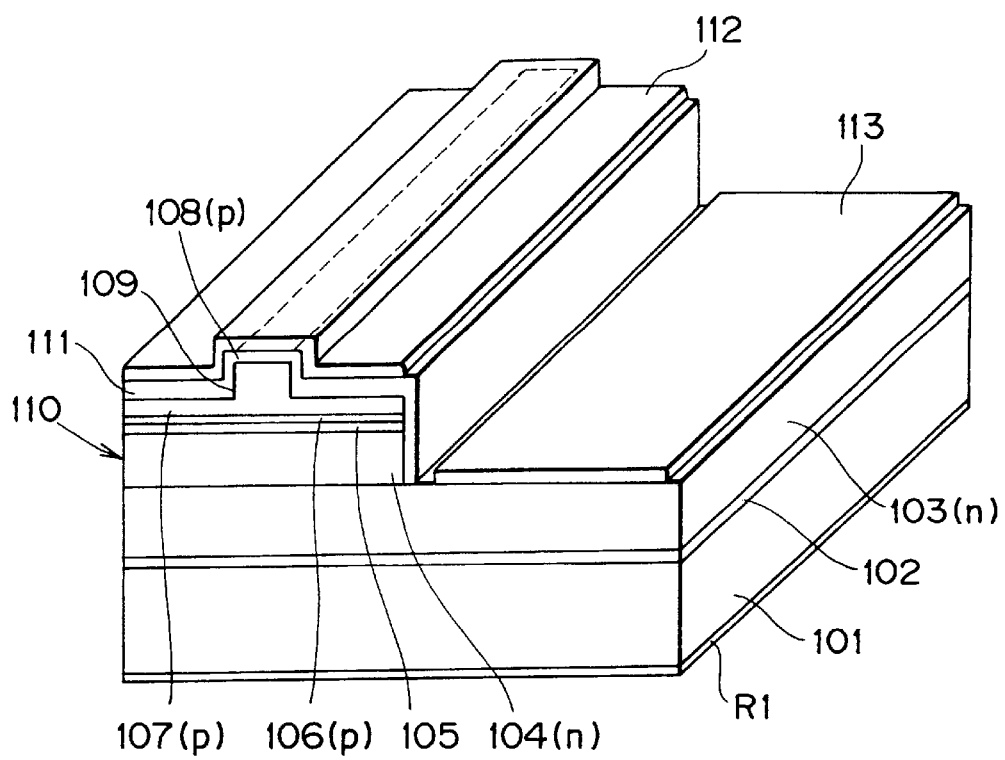
FIG. 3 is a schematic sectional view illustrating a structure of a semiconductor laser according to an embodiment of the second invention.

Hereinafter, a preferred embodiment of the second present invention will be described with reference to the drawings. FIG. 3 is a schematic sectional view illustrating a structure of a semiconductor laser according to the embodiment. In the semiconductor laser according to this embodiment, a sapphire ($Al_2O_3$) substrate is used as a translucent substrate 101. The translucent substrate 101 may be configured as a gallium nitride (GaN) substrate.

The semiconductor laser has a structure having a light emission function layer stack formed on one plane of the sapphire substrate 101, wherein two electrodes having different polarities are formed on the light emission function layer stack side, and a light leakage preventive film R1 is formed on the other plane of the sapphire substrate, that is, on the surface, opposed to the light emission function layer stack, of the sapphire substrate. The light emission function layer stack is formed by sequentially stacking a buffer layer 102, an n-side contact layer 103, an n-type cladding layer 104, an active layer 105, a p-type cap layer 106, a p-type cladding layer 107, and an p-side contact layer 108.

The buffer layer 102, which is for enhancing adhesiveness with the sapphire substrate 101, is made from undoped GaN. The n-side contact layer 103 is an n-type semiconductor layer having a high carrier concentration for ensuring an ohmic contact with the n-side electrode, and is made from GaN.

Each of the n-type cladding layer 104 and p-type cladding layer 107 functions to confine light in the active layer 105, and is required to have a refractive index lower than that of the active layer 105. Each of the n-type cladding layer and p-type cladding layer 107 is made from AlGaN.

The active layer 105 is a semiconductor layer for generating light emission by recombination of electric charges injected in the light emitting device as a current with holes. The active layer 105 is made from undoped InGaN.

The p-side contact layer 108 is a p-type semiconductor layer having a high carrier concentration for ensuring ohmic contact with the p-side electrode 112, and is made from GaN.

Each of an upper portion of the p-type cladding layer 107 and the p-side contact layer 108 has a straight stripe ridge shape extending in one direction. In the figure, reference numeral 109 designates a ridge portion composed of the upper layer portion of the p-type cladding layer 107 and the p-side contact layer 108. The ridge portion 109 has a uniform width W in the resonator length direction.

The n-type cladding layer 104, the active layer 105, the p-type cap layer 106, and a lower layer portion of the p-type cladding layer 107 have a specific mesa shape extending in one direction. In the figure, reference numeral 110 designates the mesa portion.

An $SiO_2$ current constriction layer 111, which does not absorb light from the active layer 105, is formed on both side of the ridge portion 109, to form a current constriction structure. The $SiO_2$ current constriction layer 111 is also provided on a side surface of the mesa portion for preventing short-circuit between the electrodes.

With the formation of the $SiO_2$ current constriction layer 111 on both the sides of the ridge portion 109, a stepped refractive index distribution in which the refractive index of the ridge portion 109 is higher and the refractive indexes of both sides of the ridge portion 109 are lower is formed in the direction parallel to the junction.

A p-side electrode 112 configured as an Ni/Pt/Au electrode is provided on the p-side contact layer 108 and the SiO2 current constriction layer 111 on the light emission function layer side, and an n-side electrode 113 configured as a Ti/Al electrode is provided on the n-type contact layer 103 adjacent to the mesa portion 110.

The light leakage preventive film R1 formed on the side, opposed to the light emission function layer stack, of the sapphire substrate 101 has a multi-layer structure in which dielectric thin films made from $SiO_2$ each having a thickness of $\lambda/4n$ and dielectric thin films made from $TiO_2$ each having a thickness of $\mu/4n$ are stacked in this order, where $\lambda$ is a wavelength of laser light generated in the light emission function layer stack and n is a refractive index of the dielectric thin film.

The formation of the light leakage preventive film R1 is effective to suppress light emitted from the active layer 105 from being leaked to the outside through the sapphire substrate 110 as the translucent substrate.

Figure 4:
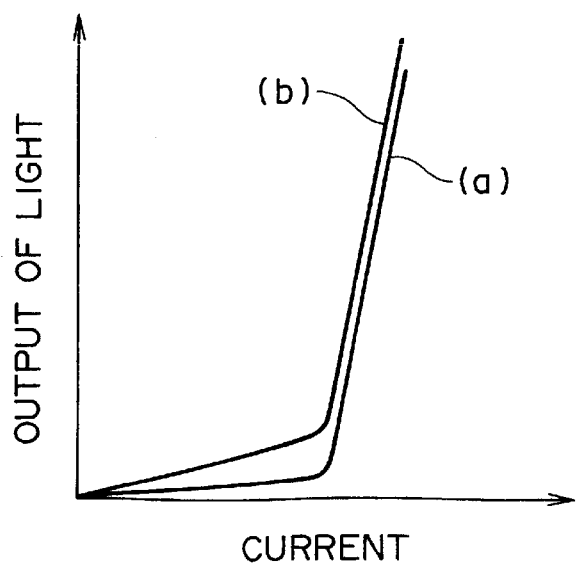
FIG. 4 is a graph illustrating a relationship between a current and an output of light.
Figure 5:
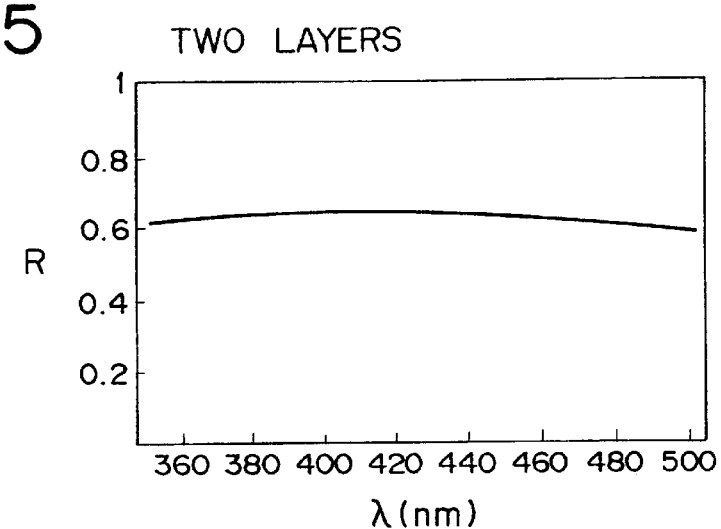
FIG. 5 is a graph illustrating a reflectance of the light leakage preventive film having a two-layer structure.
Figure 6:
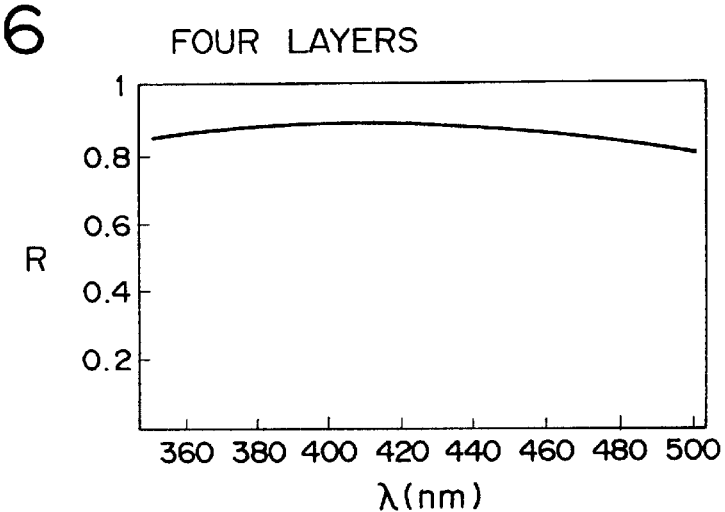
FIG. 6 is a graph illustrating a reflectance of the light leakage preventive film having a four-layer structure.
Figure 7:
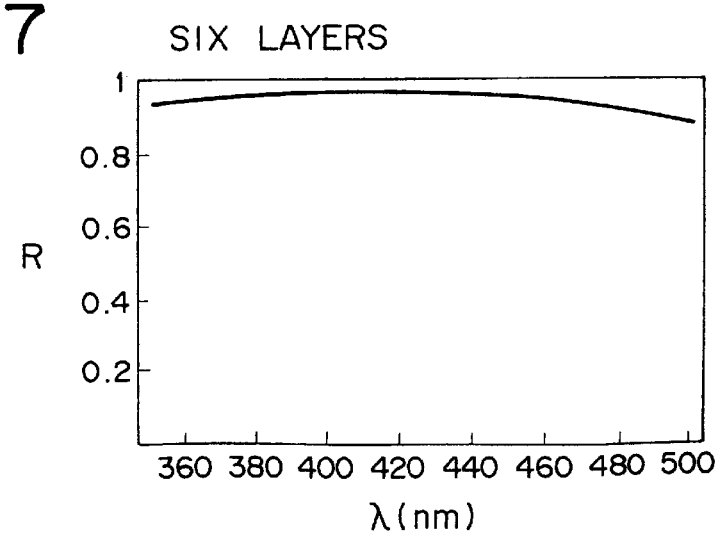
FIG. 7 is a graph illustrating a reflectance of the light leakage preventive film having a six-layer structure.
Figure 8:
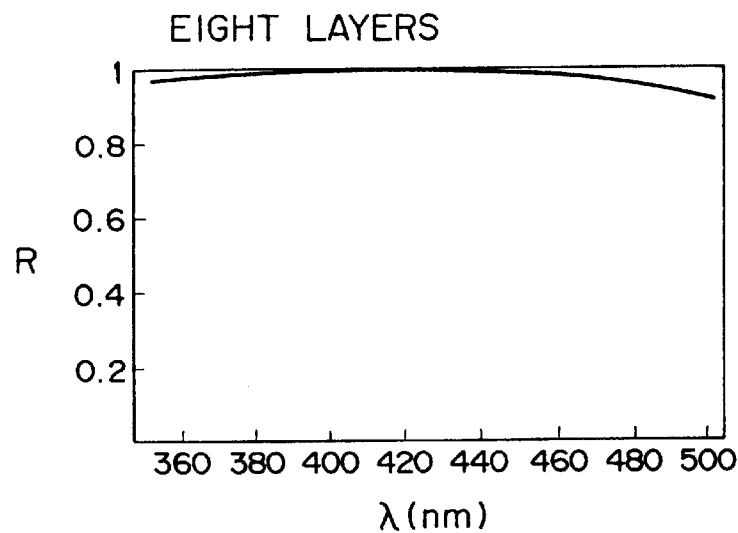
FIG. 8 is a graph illustrating a reflectance of the light leakage preventive film having an eight-layer structure.

FIG. 4 is a graph illustrating a relationship between a current given to the semiconductor laser and the output of light. In this graph, a curve (a) shows data for a semiconductor laser provided with the light leakage preventive film R1 and a curve (b) shows data for a related art semiconductor laser provided with no light leakage preventive film. As is apparent from FIG. 4, the provision of the light leakage preventive film R1 is effective to reduce the quantity of spontaneous emission light (see moderately tilted portions of the curves (a) and (b) in FIG. 4).

As the number of layers of the dielectric thin films made from $SiO_2$ and $TiO_2$ becomes larger, the reflectance of the light leakage preventive film becomes higher, and thereby the light leakage preventive effect becomes higher. The reflectances of the light leakage preventive films having the dielectric thin films of the numbers of two, four, six, and eight are shown in FIGS. 5, 6, 7, and 8, respectively. In this embodiment, the number of the dielectric thin films is specified at six from the viewpoint of effect and practical usability (easy production).

The thickness of each of the layers of the dielectric thin film is not limited to $\lambda/4n$ but may be set to any value insofar as the combination of the layers having respective thicknesses is effective to increase the reflectance.

The material of the dielectric thin film is not limited to $SiO_2$ and $TiO_2$ but may be any other material.

In place of formation of the dielectric thin films, metals such as Ti and Al may be formed by a vapor-deposition process, to form a film capable of reflecting light which has leaked from the light emission function layer stack. In this case, the Ti layer having a thickness of about 10 nm is formed as a buffer layer against the sapphire substrate and then the Al layer having a thickness of about 100 nm is formed thereon.

A semiconductor film capable of absorbing spontaneous emission light such as an InGaN film or an Si film or an insulating film having a large light absorption coefficient such as TiOx may be used as the light leakage preventive film. The formation of such a film to a thickness of about 100 to 300 nm is effective to suppress a light component leaked to the outside from the sapphire substrate.

A paint having a color capable of absorbing spontaneous emission light may be applied on the surface, opposed to the light emission function layer stack, of the sapphire substrate. In this case, the sapphire substrate provided with the light emission function layer stack may be divided into parts, each of which is assembled in a package, and then a paint is applied on the other surface of the sapphire substrate of the part; or a paint may be applied overall on the other surface of the sapphire substrate before the sapphire substrate is divided into parts.

Figure 9:
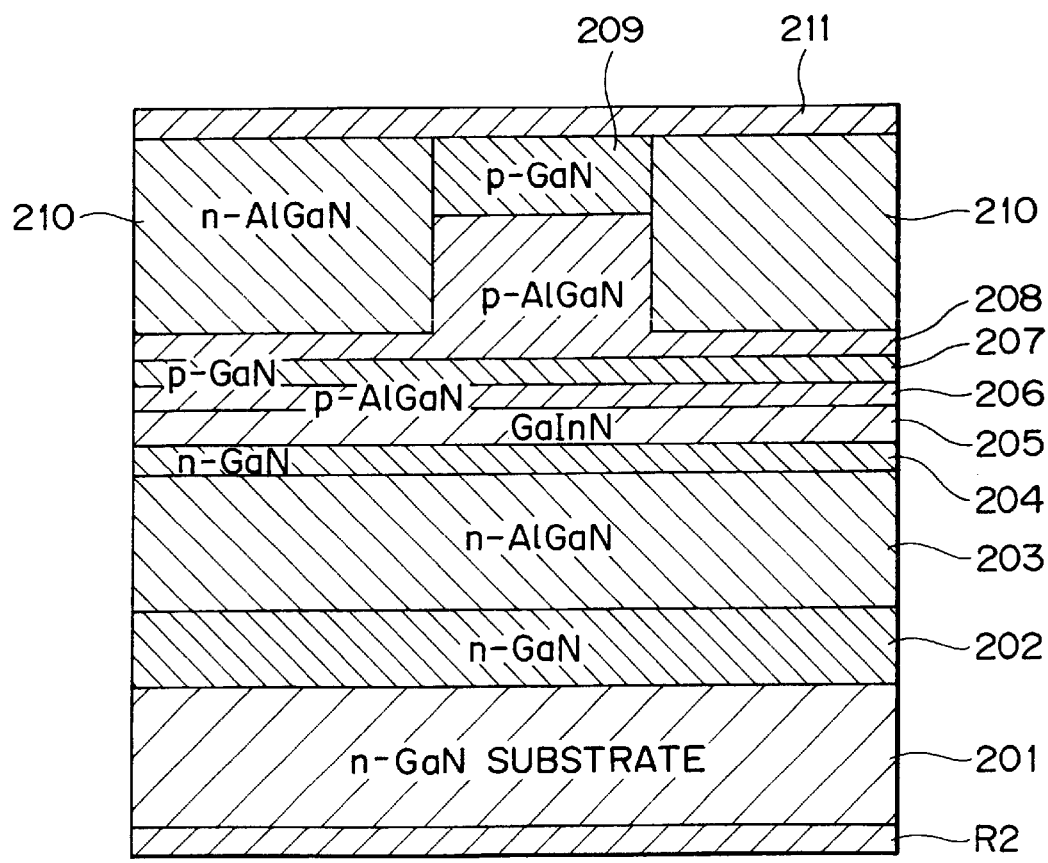
FIG. 9 is a schematic sectional view illustrating another embodiment of the second invention.

Another embodiment of the second invention will be described below. FIG. 9 is a schematic sectional view illustrating this embodiment. In this semiconductor laser, an n-type GaN substrate is used as a translucent substrate 201. A light emission function layer stack is formed on one plane of the substrate 201. The light emission function layer stack is formed by stacking a buffer layer 202, an n-side contact layer 203, an n-type cladding layer 204, an active layer 205, a p-type cap layer 206, a p-type cladding layer 207, a p-type cap layer 208, and p-type cap layer 209. A p-side electrode 211 is formed on an upper layer of the p-type cap layer 209, and an n-side electrode serving as light leakage preventive film R2 is formed on the side, opposed to the light emission function layer stack, of the n-type GaN substrate 201.

The buffer layer 202 is made from n-type GaN, the n-side contact layer 203 is made from AlGaN, the n-type cladding layer 204 is made from GaN, the active layer 205 is made from GaInN base, the p-type cap layer 206 is made from AlGaN, the p-type cladding layer 207 is made from GaN, the p-type cap layer 208 is made from AlGaN, and the p-type cap layer 209 is made from GaN.

The p-type cap layer 209 has a ridge structure and an n-type AlGaN buried layer is formed around the p-type cap layer 209.

In the semiconductor laser according to this embodiment, since the n-type GaN substrate 201 is used, the p-side electrode 211 and the n-side electrode serving as the light leakage preventive film R2 are formed on the front and back surfaces with the n-type GaN substrate 201 put therebetween. In particular, since the n-side electrode serving as light leakage preventing film R2 is formed on the side, opposed to the light emission function layer stack, of the n-type GaN substrate 201, even if light (wavelength: typically 400 nm) generated from the active layer 205 passes through the n-type GaN substrate 201, it can be prevented from being leaked to the outside by the n-side electrode serving as the light leakage preventive film R2.

The n-side electrode serving as the light leakage preventive film R2 is configured as an Al film formed by a vapor-deposition process, which is capable of reflecting light having passed through the n-type GaN substrate 201. The thickness of the n-side electrode serving as light leakage preventive film R2 may be set to a value of $\lambda/4n$ where $\lambda$ is a wavelength of laser light emitted from the active layer 205 and n is a refractive index of the film. The n-side electrode serving as light leakage preventive film R2 having the thickness specified as described above is effective to perform desirable light reflection at a high efficiency.

The n-side electrode serving as light leakage preventive film R2 may be made from a material having a conductivity and a light absorption ability. In this case, it is possible to absorb light having passed through the n-type GaN substrate 201 and hence to suppress leakage of light to the outside.

As described above, the second invention exhibits the following effects: namely, even when the semiconductor laser includes a translucent substrate, a spontaneous emission light component having passed through the substrate can be suppressed, so that the noise characteristic of a product using the semiconductor laser can be improved. Further, since the light leakage preventive film is directly formed on the translucent substrate, it is possible to suppress leaked light irrespective of the relationship with the light emission function layer stack and without exerting any effect on the laser characteristic.

Figure 10:
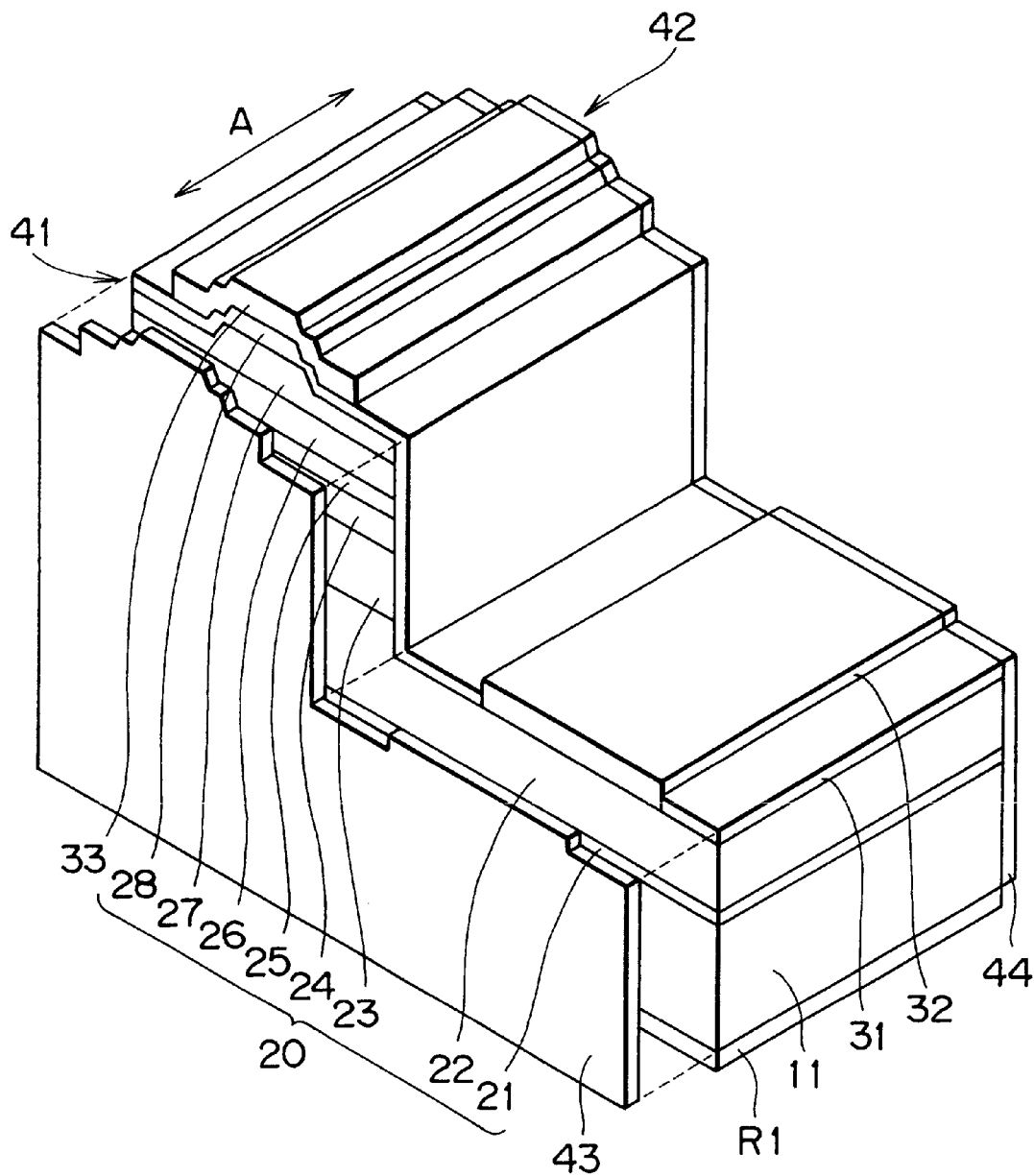
FIG. 10 is a schematic sectional view, similar to FIG. 1, of a semiconductor laser in which the second invention is combined with the first invention.

The combination of the second invention with the first invention can exhibit a higher effect. For example, as shown in FIG. 10, the light leakage preventive film R1 may be provided on the substrate of the semiconductor laser according to the first invention.

What is claimed is:

1. A semiconductor laser including a substrate, semiconductor layers stacked on said substrate, and a pair of resonator end surfaces opposed to each other in the direction perpendicular to the stacking direction, said semiconductor laser comprising:

a light emission side reflecting film formed on one of said resonator end surfaces; wherein a refractive index of said reflecting film against an emission wavelength of laser light is set to a value between an effective refractive index and a refractive index of said substrate.

2. A semiconductor laser according to claim 1, wherein each of said semiconductor layers is made from a nitride based group III-V compound semiconductor containing at least one kind of group IIIA elements and at least nitrogen of group VA elements.

3. A semiconductor laser according to claim 1, wherein said substrate is made from sapphire.

4. A semiconductor laser according to claim 1, wherein said substrate is made from gallium nitride.

5. A semiconductor laser according to claim 1, wherein said reflecting film contains at least one kind of aluminum nitride, zirconium oxide, and silicon oxynitride.

6. A semiconductor laser according to claim 1, wherein said substrate is a translucent substrate, said translucent substrate having a light leakage preventative film thereon.

* * * * *

UNITED STATES PATENT AND TRADEMARK OFFICE
CERTIFICATE OF CORRECTION

PATENT NO. : 6,693,935 B2
DATED : February 17, 2004
INVENTOR(S) : Tsuyoshi Tojo et al.

It is certified that error appears in the above-identified patent and that said Letters Patent is hereby corrected as shown below:

<u>Title page,</u>
Item [57], ABSTRACT,
Line 11, replace "place" with -- plane --.

Signed and Sealed this

Sixth Day of July, 2004

JON W. DUDAS
*Acting Director of the United States Patent and Trademark Office*